(12) United States Patent
Goetz et al.

(10) Patent No.: US 6,649,446 B1
(45) Date of Patent: Nov. 18, 2003

(54) HERMETIC PACKAGE FOR MULTIPLE CONTACT-SENSITIVE ELECTRONIC DEVICES AND METHODS OF MANUFACTURING THEREOF

(75) Inventors: Martin P. Goetz, Dallas, TX (US); Merrill A. Hatcher, Garland, TX (US); Christopher E. Jones, Arlington, TX (US)

(73) Assignee: Clarisay, Inc., Dallas, TX (US)

( * ) Notice: Subject to any disclaimer, the term of this patent is extended or adjusted under 35 U.S.C. 154(b) by 0 days.

(21) Appl. No.: 09/998,368

(22) Filed: Nov. 29, 2001

(51) Int. Cl.[7] ............................................... H01L 21/44
(52) U.S. Cl. ..................... 438/110; 438/113; 438/127
(58) Field of Search ................................ 438/106, 107, 438/108, 113, 110, 112, 114, 127; 257/678, 723, 778, 787; 174/52.2, 52.3

(56) References Cited

U.S. PATENT DOCUMENTS

| | | |
|---|---|---|
| 4,920,801 A | 5/1990 | Church |
| 5,235,135 A | 8/1993 | Knecht et al. |
| 5,345,134 A | 9/1994 | Greer |
| 5,699,027 A | 12/1997 | Tsuji et al. |
| 5,896,636 A | 4/1999 | Penunuri |
| 5,917,265 A | 6/1999 | Naumenko et al. |
| 5,952,765 A | 9/1999 | Garber et al. |
| 6,114,635 A | 9/2000 | Lakin et al. |
| 6,181,015 B1 | 1/2001 | Gotoh et al. |
| 6,225,692 B1 | 5/2001 | Hinds |
| 6,262,513 B1 | 7/2001 | Furukawa et al. |
| 6,321,444 B1 | 11/2001 | Yatsuda et al. |
| 6,368,899 B1 * | 4/2002 | Featherby et al. .......... 438/127 |
| 6,492,194 B1 * | 12/2002 | Bureau et al. ............... 438/106 |

FOREIGN PATENT DOCUMENTS

JP 8-32402 2/1996

OTHER PUBLICATIONS

"Feasibility of Surface Activated Bonding for Ultra–fine Pitch Interconnection—a New Concept of Bump–less Direct Bonding for System Level Packaging" by T. Suga; 2000 IEEE; 4 pages.

"A Novel Temperature Compensation Method for SAW Devices Using Direct Bonding Techniques" by K. Onishi, A. Namba, H. Sato, T. Ogura, S. Seki, Y. Taguchi, Y. Tomita, O. Kawasaki and K. Eda; 1997 IEEE; pp. 227–230.

"Silicon Wafer Bonding for MEMS Manufacturing" by A. A. Ayon; Solid State Technology Publication; Aug. 1999; 6 pages.

"Direct Bonding of Piezoelectric Materials Onto Si" by Kazuo Eda, Yoshihiro Tomita, Masato Sugimoto, Tetsuyoshi Ogura, Akihiko Nanba, Yutaka Taguchi and Osamu Kawasaki; 1996 IEEE; pp. 719–722.

"Si/Si Interface Bonded at Room Temperature by Ar Beam Surface Activation" by H. Takagi, R. Maeda, N. Hosoda and T. Suga; 1999; pp. 341–344.

"Even–Order Thickness–Shear Mode Resonators Using X–Cut LitaO3 Plates Realized by a Direct Bonding Technique" by M. Sugimoto, K. Takeda, T. Ohtsuchi, Y. Tomita and O. Kawasaki 1998–IEEE; pp. 919–923.

* cited by examiner

*Primary Examiner*—Kamand Cuneo
*Assistant Examiner*—Scott B. Geyer

(57) ABSTRACT

A method of manufacturing a hermetic package. In one embodiment, the method includes: (1) forming a plurality of contact-sensitive electronic devices on a device substrate, each of the plurality of devices having an active surface, (2) providing a mounting substrate, (3) forming a grid of dam material between the device substrate and the mounting substrate that is pitched as a function of lateral dimensions of the plurality of devices, (4) bringing the device substrate and the mounting substrate together until the active surface of each of the plurality of devices is proximate, but spaced apart from, the mounting substrate, the mounting substrate and the dam material cooperating to form packages for the plurality of devices and (5) dicing the device substrate to separate the packages.

18 Claims, 3 Drawing Sheets

HERMETIC PACKAGE FOR MULTIPLE CONTACT-SENSITIVE ELECTRONIC DEVICES AND METHODS OF MANUFACTURING THEREOF

TECHNICAL FIELD OF THE INVENTION

The present invention is directed, in general, to electronics packaging and, more specifically, to a hermetic package for contact-sensitive electronic devices and methods of manufacturing such package.

BACKGROUND OF THE INVENTION

Electronic signal processing by means of surface acoustic wave (SAW) devices has been widely adopted by the electronics industry. Such SAW devices can be designed to operate as analog electrical filters that operate over a wide range of frequencies and have several advantages over conventional technologies. One such advantage is that they can be designed to provide complex signal processing in a single unit. Surface acoustic wave devices also benefit from the ability to be mass produced using semiconductor microfabrication techniques which produce highly uniform devices at a substantially reduced cost. SAW devices can be easily integrated into many digital communications systems and designed to operate in high harmonic modes in the gigahertz (GHz) frequency range.

Proper operation and containment of the acoustic waves require precise construction. Existing surface acoustic wave device packaging has become well accepted in response to such requirements. Additionally, accurate and reliable performance of surface acoustic wave devices requires hermetic protection of the active surfaces of the devices. However, existing packaging practices often fails to fully and economically passivate the surface acoustic wave device active surface, thereby permitting particulate or contaminants to interfere with the active surface and render the performance of the SAW device inaccurate and unreliable. Such contamination concerns also exist with regard to other contact-sensitive electronic components, including other piezoelectric, pyroelectric, and micro-electromechanical (MEMS) applications.

Accordingly, what is needed in the art is a hermetic package for surface acoustic wave devices and other contact-sensitive electronic components, as well as a method of manufacturing such a hermetic package.

SUMMARY OF THE INVENTION

To address the above-discussed deficiencies of the prior art, the present invention provides a method of manufacturing a hermetic package. In one embodiment, the method includes: (1) forming a plurality of contact-sensitive electronic devices on a device substrate, each of the plurality of devices having an active surface, (2) providing a mounting substrate, (3) forming a grid of dam material between the device substrate and the mounting substrate that is pitched as a function of lateral dimensions of the plurality of devices, (4) bringing the device substrate and the mounting substrate together until the active surface of each of the plurality of devices is proximate, but spaced apart from, the mounting substrate, the mounting substrate and the dam material cooperating to form packages for the plurality of devices and (5) dicing the device substrate to separate the packages.

The foregoing has outlined, rather broadly, preferred features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
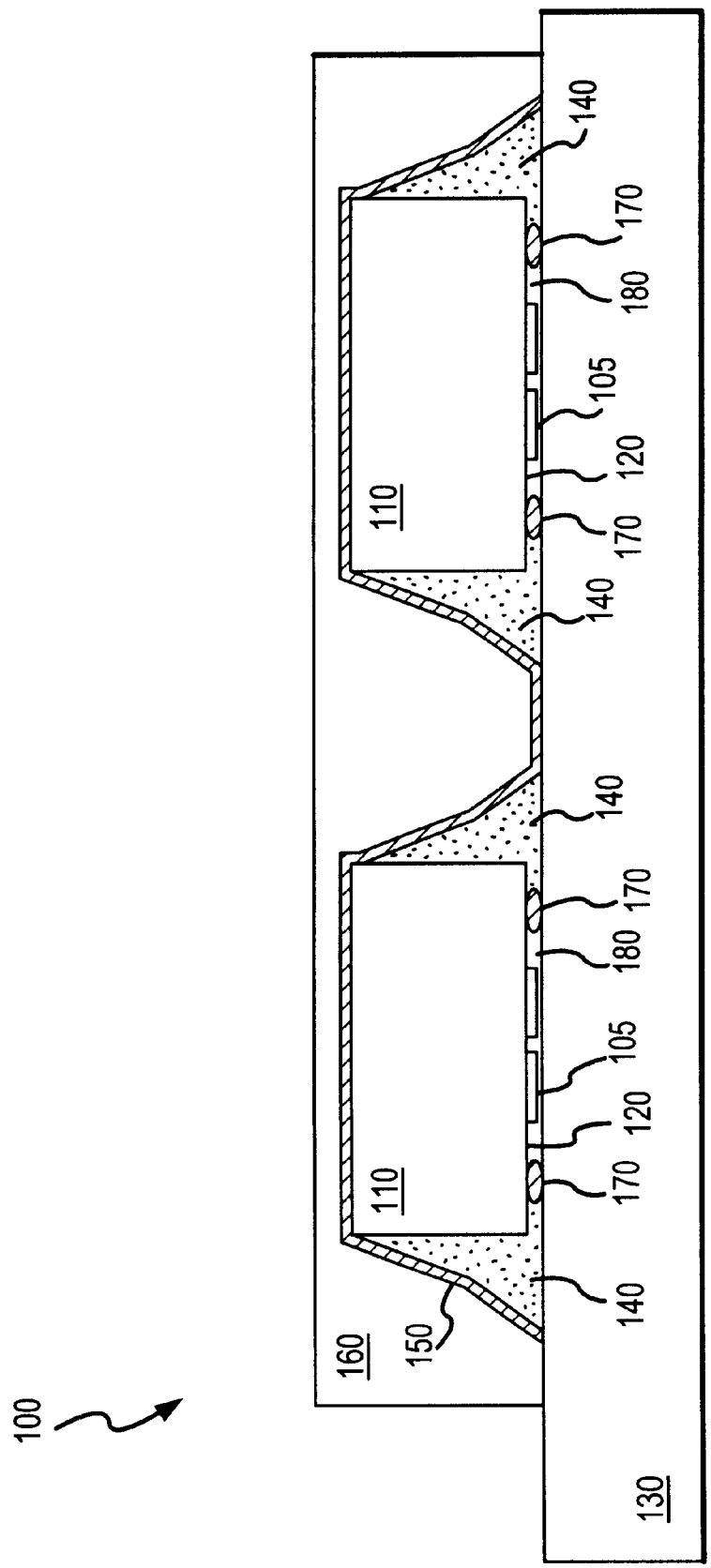
FIG. 1 illustrates a hermetic package for multiple interconnected contact-sensitive electronic devices constructed according to the principles of the present invention.

Referring initially to FIG. 1, illustrated is a block diagram of a hermetic package 100 constructed according to the principles of the present invention. The hermetic package 100 includes a mounting substrate 130 and a plurality of device substrates 110, each device substrate 110 being separated from the mounting substrate 130 by one or more electrically conductive spacers 170. In a preferred embodiment, the spacers 170 separate the active surface 120 of each device substrate 110 from the mounting substrate 130 by approximately 20 microns, but may separate the substrates 110, 130 by at most about 40 microns. As is familiar to those skilled in the art, the spacers 170 may be thermosonic gold stud bumps, such as those installed via thermosonic scrubbing. In this manner, the spacers 170 not only separate each device substrate 110 from the mounting substrate 130, but also electrically connect the mounting substrate 130 to each active surface 120, such that the electronic devices 105 may be interconnected via conductive traces (not shown) on the mounting substrate 130. Thus, conductive epoxy or solder or reflow processes are not necessary to connect the active surfaces 120 with the mounting substrate 130.

Each device substrate 110 includes a contact-sensitive electronic device 105 secured to the active surface 120. The device substrates 110 may be comprised of bismuth germanium oxide, gallium arsenide, lithium borate, lithium niobate, lithium tantalate, langasite, lead zirconium tantalate, quartz, or a combination thereof. The device substrates 110 are lodged within a dam material 140 in a manner that, in conjunction with the spacers 170, suspends each active surface 120 a predetermined distance away from the mounting substrate 130. The dam material 140 preferably encompasses a substantial portion of the perimeter of each device substrate 110, such that each device substrate 110 and the spacers 170 are located inboard of an outboard surface of a corresponding portion of the dam material 140. The dam material 140 may also extend a short distance into the gap 180 formed by an active surface 120 and the mounting substrate 130. The dam material 140 may be comprised of epoxy resin, polyimide, benzocyclobutene, silicone or cyanoacrylate, and is preferably a lower viscosity material than previously used to mount contact-sensitive device substrates to mounting substrates. Note, however, that no underfill materials are necessary in package 100 to hermetically seal the active surface 120, such that the lower viscosity material relied on by prior designs is avoided by the use of the higher viscosity dam material 140 and a hermetic seal 150.

The hermetic seal 150 covers the dam material 140. The hermetic seal 150 may also cover one or more device substrates 110, or a portion thereof, and may also cover a portion of the mounting substrate 130. At a minimum, however, the hermetic seal 150 seals each gap 180 within the dam material 140, such that particulate and contaminants are precluded from contacting each electronic device 105. Each gap 180 may also be evacuated, such that each gap 180 may be under a vacuum. By evacuating each gap 180, and subsequently sealing each gap 180 with the hermetic seal 150, operation of each electronic device 105 will not be disturbed or otherwise influenced by unwanted particulate or contaminants. In this manner, the unpassivated and contact-sensitive electronic devices 105 may be passivated, thereby ensuring hermeticity and predictable performance of each device 105. The hermetic seal 150 may be applied to the package 100 by sputtering or otherwise depositing organic or inorganic material over the desired surfaces, and may comprise silicon nitride, silicon carbide, silicon oxide, aluminum nitride, or aluminum oxide.

The hermetic package 100 may also include a passivation layer 160 covering all or a portion of the hermetic seal 150, the dam material 140, the device substrates 110 and/or the mounting substrate 130. The passivation layer 160 is primarily utilized to resolve mechanical and handling issues. By protecting the package 100 with the passivation layer 160, the threat of damage encountered in subsequent manual or automated handling and assembly procedures (e.g., pick-and-place procedures) may be mitigated. The passivation layer 160 may be comprised of a standard encapsulant epoxy resin conventionally used and known to those skilled in the art. The passivation layer 160 may be applied to the package 100 either by injection, transfer molding or liquid disposition.

In an alternative embodiment, the dam material 140 and/or the passivation layer 160 may hermetically seal the gap 180 to a degree sufficient for the proper and accurate operation of the electronic device 105 required of a particular application. That is, the dam material 140 and/or the passivation layer 160 may provide sufficient mechanical, environmental and hermetic protection of the electronic device 105 in the absence of a discrete hermetic seal 150. In such instances, the hermetic seal 150 may be comprised of the portion of the dam material 140 and/or the passivation layer 160 that forms such sufficient hermetic protection, instead of requiring a separate, distinct material or layer. For instance, the portion of the dam material 140 that provides hermetic protection of the electronic device 105 may be outboard of and therefore located over the portion of the dam material 140 not physically functioning to provide sufficient hermetic protection. In this manner, the hermetic seal 150 may still be "located over" the dam material 140 despite actually being the same material as the dam material 140.

Although the package 100 is originally intended to satisfy the hermeticity needs of surface acoustic wave devices, one skilled in the art can foresee other piezoelectric, pyroelectric, micro-electromechanical (MEMS) or mirror device applications that would benefit from the hermetic passivation ensured by this architecture.

Figure 2:
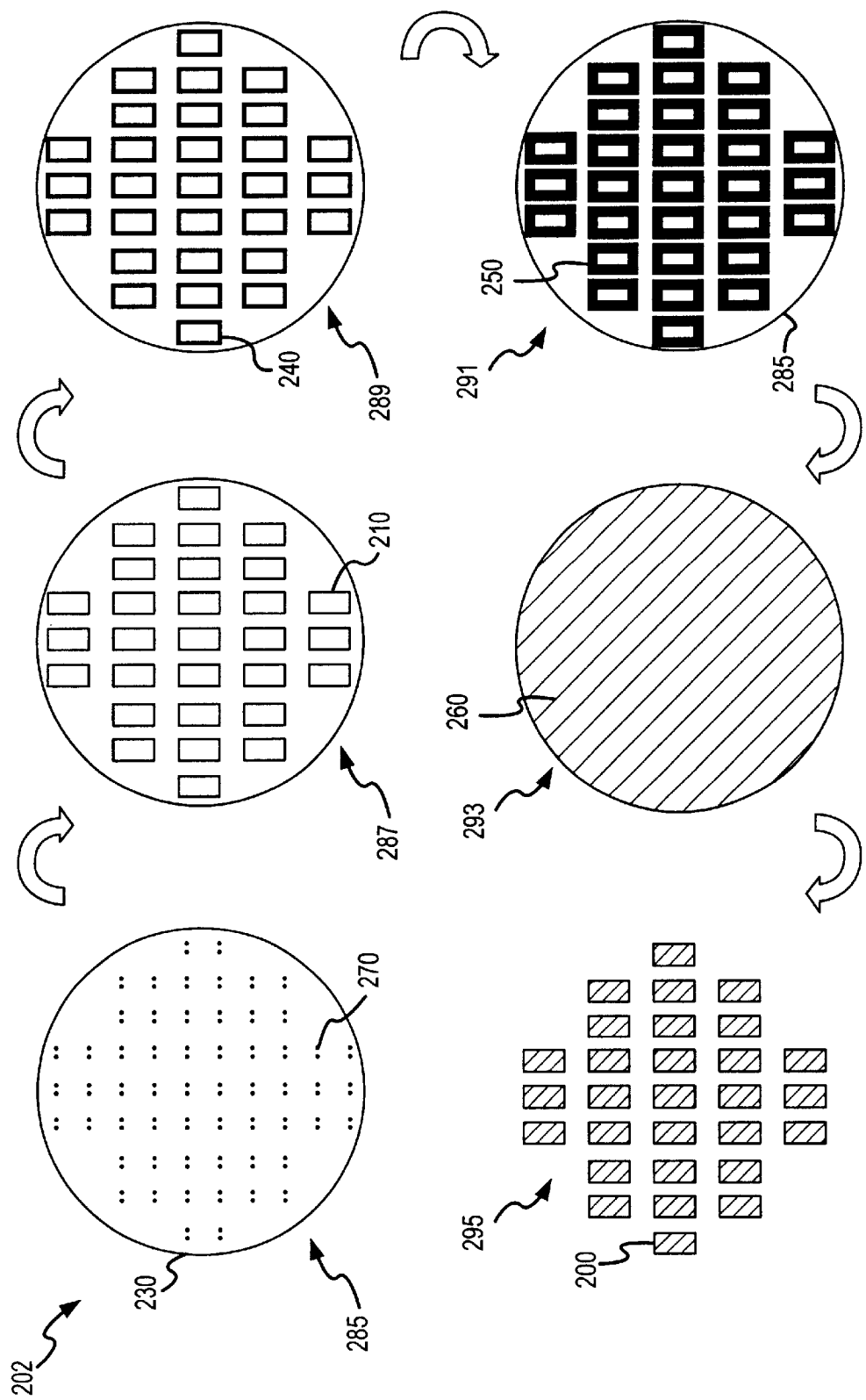
FIG. 2 illustrates a method of manufacturing a hermetic package for multiple interconnected contact-sensitive electronic devices.

Turning now to FIG. 2, illustrated is a method 202 of manufacturing an embodiment of a hermetic package 200 containing a plurality of interconnected contact-sensitive electronic devices. In a first manufacturing step 285, a substantially planar piezoelectric wafer 230, such as a 4-inch piezoelectric wafer, is provided as a mounting substrate. The piezoelectric wafer 230 may comprise many known or hereinafter discovered piezoelectric materials. However, in one advantageous embodiment of the present invention, the piezoelectric wafer 230 comprises a material selected from the group consisting of bismuth germanium oxide, gallium arsenide, lithium borate, lithium niobate, lithium tantalate, langasite, lead zirconium tantalate, or quartz, or a combination thereof.

Subsequent to providing the piezoelectric wafer 230, a plurality of electrically conductive spacers 270 may be positioned over the piezoelectric wafer 230. In a second manufacturing step 287, the device substrate 210 of each of a plurality of contact-sensitive electronic devices is secured to the piezoelectric wafer 230 via a corresponding one of the plurality of spacers 270. A preferred embodiment includes the use of a thermosonic scrub (e.g., a gold-to-gold scrub) to secure the device substrates 210 to the piezoelectric wafer 230, wherein an electrically conductive spacer component (not shown) connected to a terminal of an active surface (not shown) of the device substrate 210 is bonded by temperature and/or vibration ("scrubbing") to an electrically conductive spacer component (not shown) connected to a terminal (not shown) of the piezoelectric wafer 230.

However, it should be understood by those skilled in the art that many other processes may be used to secure the electronic devices (via device substrates 210) to the piezoelectric wafer 230. Note, however, that no conductive epoxy or solder or additional reflow process is necessarily required to secure the device substrates 210 to the piezoelectric wafer 230. In securing the plurality of device substrates 210 to the piezoelectric wafer 230 via the electrically conductive spacers 270, the electronic devices may be interconnected via conductive traces (not shown) on the piezoelectric wafer 230.

Step 287 further secures the device substrates 210 to the piezoelectric wafer 230 such that the spacers 270 may preferably separate the active surfaces (not shown) of each of the plurality of device substrates 210 from the piezoelectric wafer 230 by approximately 20 microns. However, the spacers 270 may separate the active surfaces of each of the plurality of device substrates 210 from the piezoelectric wafer 230 by at most about 40 microns.

In a third manufacturing step 289, a dam material 240 is dispensed around the perimeter of each device substrate 210. The dam material 240 may be comprised of epoxy resin, polyimide, benzocyclobutene, silicone or cyanoacrylate, and is preferably a lower viscosity material than previously used to mount contact-sensitive device substrates to piezoelectric wafers. Note, however, that no underfill material, such as a material typically of lower viscosity than the dam material 240 used here, is required in any of the present embodiments. The dam material 240 may flow a short distance into the gaps (not shown) formed by the active surfaces of each of the plurality of device substrates 210, but less of the dam material 240 flows into the gap than in conventional processes. It is because of this lack of flow of the dam material 240 towards the active surfaces of the devices substrates 210 that the conventional use of a window-shaped dam around the device active surface is not necessary.

In subsequent manufacturing step 291, a hermetic seal 250 is formed over the dam material 240 and at least a portion of the piezoelectric wafer 230 and one or more device substrates 210, thereby forming a hermetic wafer assembly 285. The hermetic seal 240 ensures that the electronic device will not be disturbed or otherwise influenced by unwanted particulate or contaminants. In this manner, an unpassivated and contact-sensitive electronic device may be passivated, thereby ensuring hermeticity and predictable performance of the electronic device. The hermetic seal 240 may comprise silicon nitride, silicon carbide, silicon oxide, aluminum nitride, or aluminum oxide.

Method 202 may also include a manufacturing step 293, wherein a passivation layer 260 is formed over the hermetic seal 240. The passivation layer 260 may also be formed over all or a em portion of the dam material 240, the piezoelectric wafer 230, and/or one or more device substrates 210. The passivation layer 260 may also be formed over the entire hermetic wafer assembly 285. The passivation layer 260 may be formed by injection, transfer molding or liquid dispensing. Note, however, that in an alternative embodiment, the step 293 formation of the passivation layer 260 may be excluded from method 202.

In a final manufacturing step 295, the hermetic wafer assembly 285 may be separated into the individual hermetic packages 200 containing one or more hermetically sealed electronic devices. In an exemplary embodiment, the hermetic wafer assembly 285 may be separated into the individual hermetic packages 200 using wafer dicing, however, one skilled in the art understands that any compatible separation technique may be used.

Figure 3:
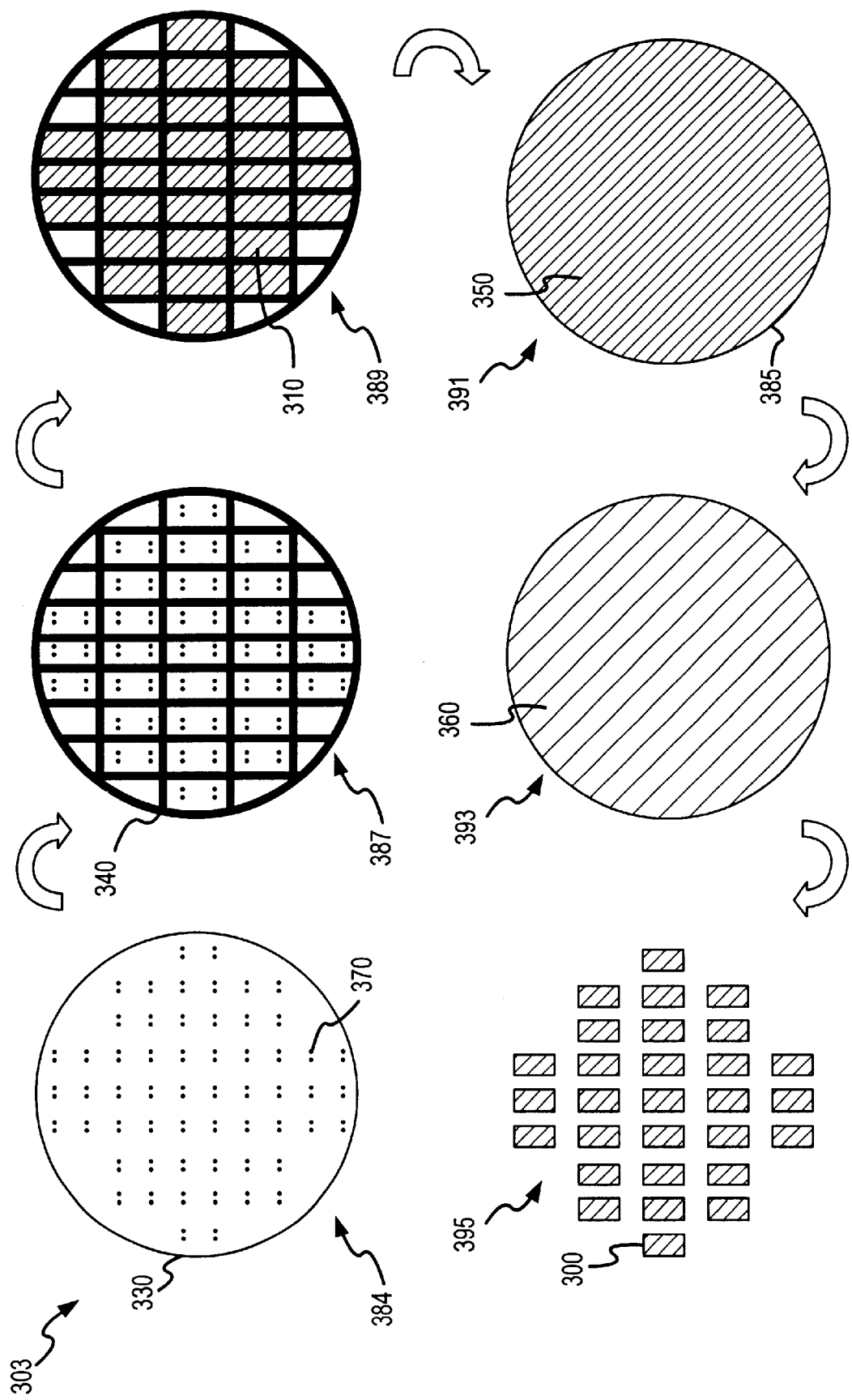
FIG. 3 illustrates an alternative method of manufacturing a hermetic package for multiple interconnected contact-sensitive electronic devices.

Turning finally to FIG. 3, illustrated is an alternative method 303 of manufacturing an embodiment of a hermetic package 300 containing a plurality of interconnected contact sensitive electronic devices, which in the present embodiment may be similar to the hermetic package 100 illustrated in FIG. 1. In a first manufacturing step 385, a substantially planar piezoelectric wafer 330, such as a 4-inch piezoelectric wafer, is provided as a mounting substrate. The piezoelectric wafer 330 may comprise many known or hereinafter discovered piezoelectric materials. However, in one advantageous embodiment of the present invention, the piezoelectric wafer 330 comprises a material selected from the group consisting of bismuth germanium oxide, gallium arsenide, lithium borate, lithium niobate, lithium tantalate, langasite, lead zirconium tantalate, or quartz, or a combination thereof.

Subsequent to providing the piezoelectric wafer 330, a plurality of electrically conductive spacers 370 may be positioned over the piezoelectric wafer 330. The spacers 370 may be positioned over the piezoelectric wafer 330 by many processes known to those skilled in the art, but are preferably positioned using the thermosonic scrub process described above in reference to FIG. 2.

In a second manufacturing step 387, a dam material 340 is arranged on the piezoelectric wafer 330 in a pattern configured to receive a substantial portion of a perimeter of each device substrate 310 of a plurality of interconnected contact-sensitive electronic devices. The dam material 340 may also be comprised of epoxy resin, polyimide, benzocyclobutene, silicone or cyanoacrylate, and is preferably a material of lower viscosity than previously used to mount contact-sensitive device substrates to piezoelectric wafers. Note, however, that no underfill material, such as a material typically of lower viscosity than the dam material used here, is required in any of the present embodiments.

In a third manufacturing step 389, the plurality of device substrates 310 are lodged within the dam material 340 arranged in step 387. In this step 389, the dam material 340 may flow a short distance into the gaps (not shown) formed by the active surfaces of each of the plurality of device substrates 310, but because the dam material 340 is of higher viscosity than that conventionally used, less of the dam material 340 flows into the gap than in conventional processes. It is because of this lack of flow of the dam material 340 towards the active surfaces of the device substrates 310 that the conventional use of a window-shaped dam around the device active surface is not necessary.

Manufacturing step 389 also preferably includes the use of the thermosonic scrub process described above in reference to FIG. 2 to secure the device substrate 310 of each of the plurality of contact-sensitive electronic devices to the piezoelectric wafer 330 via a corresponding one of the plurality of spacers 370. However, it should be understood by those skilled in the art that many other processes may be used to secure the electronic devices (via device substrates 210) to the piezoelectric wafer 330. Note, however, that no conductive epoxy or solder or additional reflow process is necessarily required to secure the device substrates 310 to the piezoelectric wafer 330. In securing 4, the plurality of device substrates 310 to the piezoelectric wafer 330 via the electrically conductive spacers 370, the electronic devices may be interconnected via conductive traces (not shown) on the piezoelectric wafer 330.

Step 389 further secures the device substrates 310 to the piezoelectric wafer 330 such that the spacers 370 may preferably separate the active surfaces (not shown) of each of the plurality of device substrates 310 from the piezoelectric wafer 330 by approximately 20 microns. However, the spacers 370 may separate the active surfaces of each of the plurality of device substrates 310 from the piezoelectric wafer 330 by at most about 40 microns.

In subsequent manufacturing step 391, a hermetic seal 350 is formed over the dam material 340 and at least a portion of piezoelectric wafer 330 and one or more device substrates 310, thereby forming a hermetic wafer assembly 385. Alternatively, the hermetic seal 350 may be formed over the entire piezoelectric wafer 330. The hermetic seal 350 ensures that the electronic device will not be disturbed or otherwise influenced by unwanted particulate or contaminants. In this manner, an unpassivated and contact-sensitive electronic device may be passivated, thereby ensuring hermeticity and predictable performance of the electronic device. The hermetic seal 350 may comprise silicon nitride, silicon carbide, silicon oxide, aluminum nitride, or aluminum oxide.

Method 303 may also include a manufacturing step 393, wherein a passivation layer 360 is formed over the hermetic seal 350. If the hermetic seal 350 has not been formed over the entire piezoelectric wafer 330, the passivation layer 360 may also be formed over all or a portion of the dam material 340, the piezoelectric wafer 330, and/or one or more device substrates 310. The passivation layer 360 may be formed by injection, transfer molding or liquid dispensing. Note, however, that in an alternative embodiment, the step 393 formation of the passivation layer 360 may be excluded from method 303.

In a final manufacturing step 395, the hermetic wafer assembly 385 may be separated into the individual hermetic packages 300 containing one or more hermetically sealed electronic devices. In an exemplary embodiment, the hermetic wafer assembly 385 may be seperated into the individual hermetic packages 300 using wafer dicing, however, one skilled in the art understands that compatible seperation techniques may be used.

Although the present invention has been described in detail, those skilled in the art should understand that they can make various changes, substitutions and alterations herein without departing from the spirit and scope of the invention in its broadest form.

What is claimed is:

1. A method of mnanufacturing a hermetic package, comprising:

forming a plurality of contact-sensitive electronic devices on a device substrate, each of said plurality of devices having an active surface;

providing a mounting substrate;

forming a grid of dam material between said device substrate and said mounting substrate that is pitched as a function of lateral dimensions of said plurality of devices;

bringing said device substrate and said mounting substrate together until said active surface of each of said plurality of devices is proximate, but spaced apart from, said mounting substrate, said mounting substrate and said dam material cooperating to form packages for said plurality of devices, wherein said bringing and said forming a grid of dam material are carried out in a single step; and dicing said device substrate to separate said packages.

2. The method as recited in claim 1 further comprising forming a hermetic seal over said dam material.

3. The method as recited in claim 2 further comprising forming a passivation layer over said hermetic seal.

4. The method as recited in claim 2 wherein said hermetic seal is formed from one selected from the group consisting of:

silicon nitride, silicon carbide, silicon oxide, aluminum nitride, and aluminum oxide.

5. The method as recited in claim 1 wherein said dam material is selected from the group consisting of:

epoxy resin;

polyamide;

benzocyclobutene;

silicone; and cyanoacrylate.

6. The method as recited in claim 1 wherein said each of said plurality of interconnected contact-sensitive electronic devices is selected from the soup consisting of:

a surface acoustic wave device, a micro-electromechanical system device, a mirror device, a pyroelectric device, and a piezoelectric device.

7. The method as recited in claim 1 further comprising positioning a plurality of electrically conductive spacers to physically separate said active surface from said mounting substrate by a predetermined distance.

8. The method as recited in claim 7 wherein said positioning further comprises positioning each of said plurality of electrically conductive spacers inboard of said dam material with respect to said active surface.

9. The method as recited in claim 1 wherein said active surface of each of said plurality of devices is separated from said mounting substrate by at most about 40 microns.

10. The method as recited in claim 1 further comprising:

forming a hermetic seal over said dam material; and forming a passivation layer over said hermetic seal.

11. The method as recited in claim 1 further comprising positioning a plurality of electrically conductive spacers to physically separate said active surface from said mounting substrate by a predetermined distance, including positioning each of said plurality of electrically conductive spacers inboard of said dam material with respect to said active surface.

12. A method of manufacturing a hermetic package, comprising:

forming a plurality of surface acoustic wave devices on a device substrate, each of said plurality of devices having an active surface;

providing a mounting substrate;

fomuing a grid of dam material between said device substrate and said mounting substrate that is pitched as a finction of lateral dimensions of said plurality of devices;

bringing said device substrate and said mounting substrate together until said active surface of each of said plurality of devices is proximate, but spaced apart from, said mounting substrate, said mounting substrate and said dam material cooperating to form packages for said plurality of devices;

dicing said device substrate to separate said packages; and forming a hermetic seal over said dam material at edges of each of said packages.

13. The method as recited in claim 12 further comprising forming a passivation layer over said hermetic seal.

14. The method as recited in claim 12 wherein said dam material is selected from the group consisting of:

epoxy resin;

polyirde;

benzocyclobutene;

silicone; and cyanoacrylate.

15. The method as recited in claim 12 wherein said hermetic seal is formed from one selected from the group consisting of:

silicon nitride, silicon carbide, silicon oxide, aluminum nitride, and aluminum oxide.

16. The method as recited in claim 12 further comprising positioning a plurality of electrically conductive spacers to physically separate said active surface from said mounting substrate by a predetermined distance.

17. The method as recited in claim 16 wherein said positioning further comprises positioning each of said plurality of electrically conductive spacers inboard of said dam material with respect to said active surface.

18. The method as recited in claim 12 wherein said active surface of each of said plurality of devices is separated from said mounting substrate by at most about 40 microns.

* * * * *

UNITED STATES PATENT AND TRADEMARK OFFICE
CERTIFICATE OF CORRECTION

PATENT NO. : 6,649,446 B1  Page 1 of 1
DATED : November 18, 2003
INVENTOR(S) : Goetz et al.

It is certified that error appears in the above-identified patent and that said Letters Patent is hereby corrected as shown below:

Column 5,
Line 14, delete "em"

Column 6,
Line 21, delete "4,"
Line 66, "seperation" should be -- separation --

Column 7,
Line 43, "polyamide" should be -- polyimide --
Line 50, "soup" should be -- group --

Column 8,
Line 19, "fomuing" should be -- forming --
Line 22, "finction" should be -- function --
Line 40, "polyirde" should be -- polyimide --

Signed and Sealed this

Sixteenth Day of March, 2004

JON W. DUDAS
*Acting Director of the United States Patent and Trademark Office*